(12) United States Patent
Yu et al.

(10) Patent No.: US 9,660,049 B2
(45) Date of Patent: May 23, 2017

(54) SEMICONDUCTOR TRANSISTOR DEVICE WITH DOPANT PROFILE

(71) Applicant: TAIWAN SEMICONDUCTOR MANUFACTURING CO., LTD., Hsin-Chu (TW)

(72) Inventors: Tsung-Hsing Yu, Taipei (TW); Chia-Wen Liu, Taipei (TW); Ken-Ichi Goto, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/672,298

(22) Filed: Mar. 30, 2015

(65) Prior Publication Data

US 2015/0249141 A1    Sep. 3, 2015

Related U.S. Application Data

(63) Continuation-in-part of application No. 13/288,201, filed on Nov. 3, 2011, now Pat. No. 8,993,424.

(51) Int. Cl.
*H01L 29/66* (2006.01)
*H01L 29/78* (2006.01)
(Continued)

(52) U.S. Cl.
CPC .... *H01L 29/66492* (2013.01); *H01L 29/0847* (2013.01); *H01L 29/105* (2013.01);
(Continued)

(58) Field of Classification Search
CPC .......... H01L 29/66651; H01L 29/0847; H01L 29/1045; H01L 29/1054; H01L 29/6659;
(Continued)

(56) References Cited

U.S. PATENT DOCUMENTS

| | | |
|---|---|---|
| 5,786,251 A | 7/1998 | Harris et al. |
| 6,229,148 B1 | 5/2001 | Prall et al. |

(Continued)

OTHER PUBLICATIONS

Hokazono, A. et al., "Steep Channel Profiles in n/pMOS Controlled by Boron-doped Si:C Layers for Continual Bulk CMOS Scaling", 2009 IEEE International Electron Devices Meeting (IEDM), 4 pages.

(Continued)

*Primary Examiner* — Joshua King
*Assistant Examiner* — Mohammed R Alam
(74) *Attorney, Agent, or Firm* — Duane Morris LLP

(57) ABSTRACT

A transistor and a method for forming the transistor are provided. The method includes performing at least one implantation operation in the transistor channel area, then forming a silicon carbide/silicon composite film over the implanted area prior to introducing further dopant impurities. A halo implantation operation with a low tilt angle is used to form areas of high dopant concentration at edges of the transistor channel to alleviate short channel effects. The transistor structure includes a reduced dopant impurity concentration at the substrate interface with the gate dielectric and a peak concentration about 10-50 nm below the surface. The dopant profile has high dopant impurity concentration areas at opposed ends of the transistor channel.

20 Claims, 16 Drawing Sheets

SiC/SiB/SiC/Si Epi depo

(51) Int. Cl.
  *H01L 29/10* (2006.01)
  *H01L 29/165* (2006.01)
  *H01L 29/08* (2006.01)
  *H01L 21/265* (2006.01)
  *H01L 29/51* (2006.01)

(52) U.S. Cl.
  CPC ...... *H01L 29/1045* (2013.01); *H01L 29/1054* (2013.01); *H01L 29/165* (2013.01); *H01L 29/6659* (2013.01); *H01L 29/66651* (2013.01); *H01L 29/7833* (2013.01); *H01L 21/26506* (2013.01); *H01L 21/26586* (2013.01); *H01L 29/517* (2013.01); *Y10S 438/931* (2013.01)

(58) Field of Classification Search
  CPC ................. H01L 29/165; H01L 29/105; H01L 21/26506; Y10S 438/931
  See application file for complete search history.

(56) References Cited

U.S. PATENT DOCUMENTS

| | | |
|---|---|---|
| 6,358,806 B1 | 3/2002 | Puchner |
| 6,372,587 B1 | 4/2002 | Cheek et al. |
| 6,514,843 B2 | 2/2003 | Dokumaci et al. |
| 6,521,949 B2 | 2/2003 | Assaderaghi et al. |
| 7,011,998 B1 * | 3/2006 | Ju .................... H01L 21/26586 257/335 |
| 7,015,549 B2 | 3/2006 | Kim et al. |
| 7,132,338 B2 | 11/2006 | Samoilov et al. |
| 7,351,637 B2 | 4/2008 | Tucker |
| 2003/0006459 A1 | 1/2003 | Adkisson et al. |
| 2003/0124823 A1 | 7/2003 | Jain et al. |
| 2006/0141716 A1 | 6/2006 | Rouh et al. |
| 2007/0013006 A1 | 1/2007 | Mirabedini et al. |
| 2007/0096148 A1 | 5/2007 | Hoentschel et al. |
| 2008/0029815 A1 | 2/2008 | Chen et al. |
| 2008/0061379 A1 | 3/2008 | Chen et al. |
| 2008/0085580 A1 | 4/2008 | Doyle et al. |
| 2008/0102573 A1 | 5/2008 | Liang et al. |
| 2008/0179636 A1 | 7/2008 | Chidambarrao et al. |
| 2008/0293204 A1 | 11/2008 | Nieh et al. |
| 2009/0102026 A1 | 4/2009 | Lee et al. |
| 2009/0166685 A1 * | 7/2009 | Hokazono ......... H01L 21/26513 257/288 |
| 2009/0179280 A1 * | 7/2009 | Kohli ............... H01L 21/26506 257/408 |
| 2009/0224287 A1 * | 9/2009 | Shin .................. H01L 21/82380 257/192 |
| 2009/0289305 A1 | 11/2009 | Majumdar et al. |
| 2010/0237417 A1 | 9/2010 | Wang et al. |
| 2011/0049624 A1 | 3/2011 | Guo et al. |
| 2011/0049626 A1 | 3/2011 | Lin et al. |
| 2011/0309447 A1 | 12/2011 | Arghavani et al. |
| 2012/0007185 A1 * | 1/2012 | Yin .................. H01L 21/26586 257/368 |
| 2012/0045873 A1 * | 2/2012 | Jeong ............... H01L 21/82380 438/198 |
| 2013/0043511 A1 | 2/2013 | Tsai et al. |

OTHER PUBLICATIONS

Hokazono, A. et al., "Steep Channel & Halo Profiles Utilizing Boron-Barrier Layers (Si:C) for 32 nm Node and Beyond", IEEE 2008 Symposium on VLSI Technology Digest of Technical Papers, pp. 112-113.

* cited by examiner

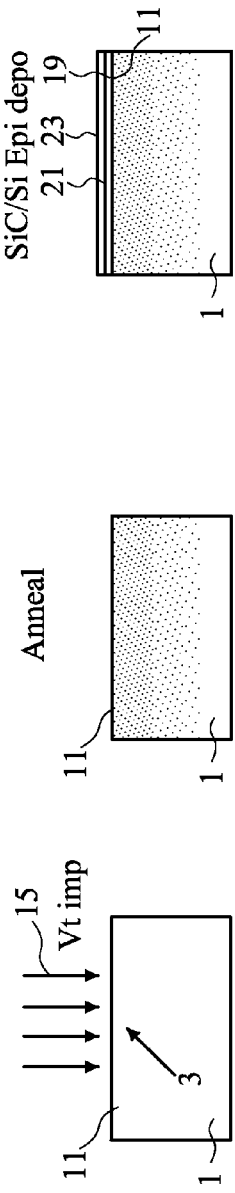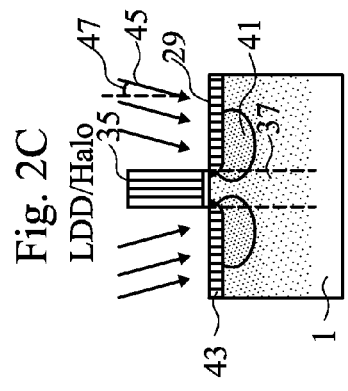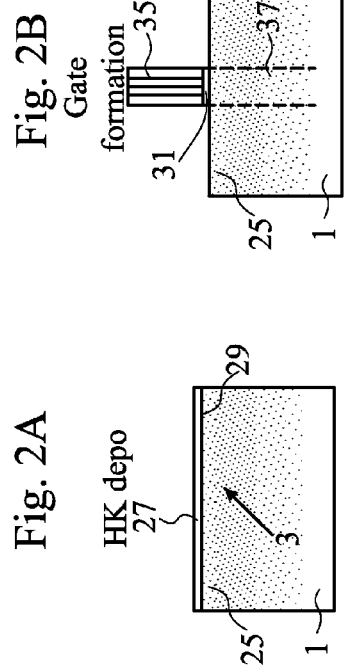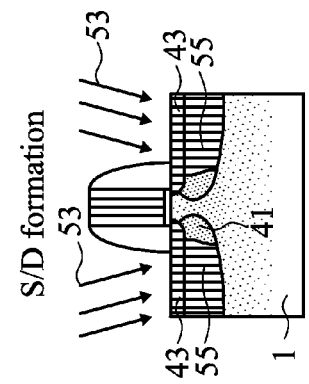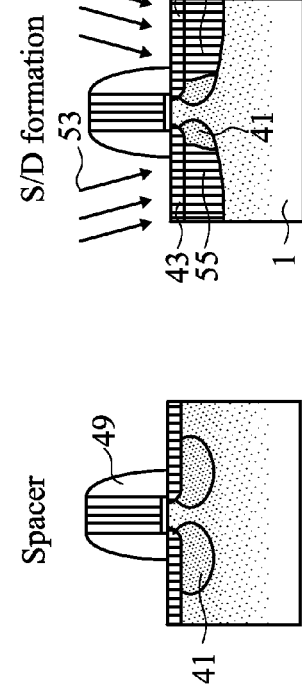

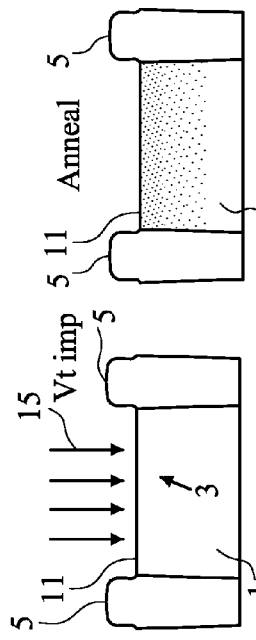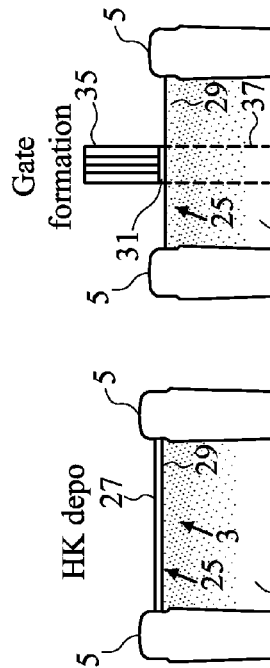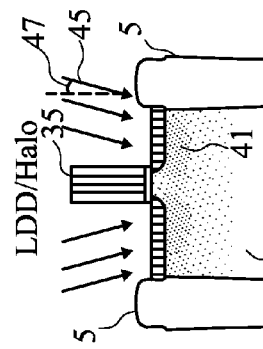

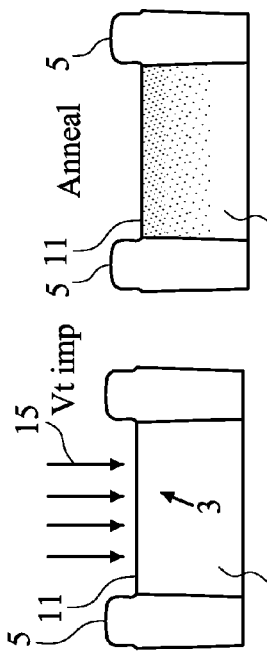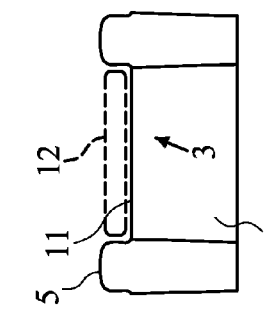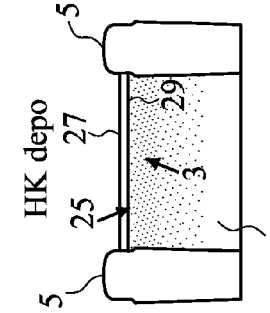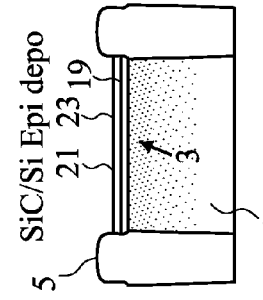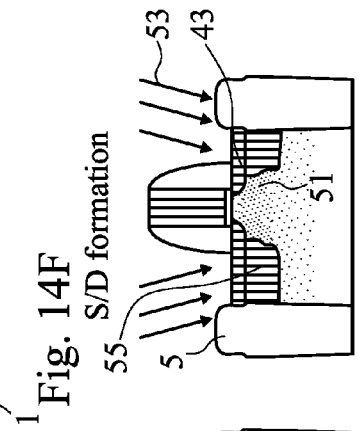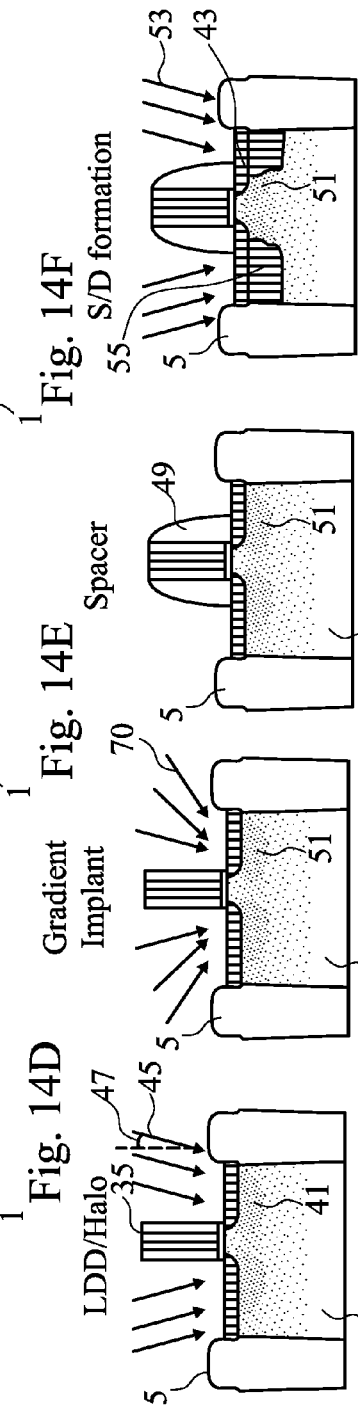

SEMICONDUCTOR TRANSISTOR DEVICE WITH DOPANT PROFILE

REFERENCE TO RELATED APPLICATIONS

This application is a continuation-in-part of U.S. patent application Ser. No. 13/288,201, filed Nov. 3, 2011, which is incorporated by reference herein in its entirety.

BACKGROUND

The disclosure relates to semiconductor devices and manufacturing methods for the same. Transistors are highly utilized components in integrated circuit and other semiconductor devices. Transistors are used for amplifying or switching electronic signals and provide functionality to the integrated circuit or other semiconductor devices. Transistors can be N-type transistors with N-type transistor channels, or P-type transistors with P-type transistor channels. Transistors can be formed using various techniques and materials. Dopant impurities are introduced into the channel region of transistors to directly influence the functionality and performance of the transistor devices. The characteristics and location of the dopant impurities, i.e. the dopant profile, are carefully controlled.

Several separate processing operations are used in combination to form the structural features of transistor devices and introduce and place the dopant impurities at proper concentration levels, in the transistor channel and other regions such as the source/drain regions. Fluctuations in any of these processing operations can cause variation in the transistor device and performance degradation. This is especially true with respect to the operations used to introduce and place dopant impurities in the transistor channel and other regions such as the source/drain regions.

BRIEF DESCRIPTION OF THE DRAWING

The present disclosure is best understood from the following detailed description when read in conjunction with the accompanying drawing. According to common practice, the various features of the drawing are not necessarily to scale. On the contrary, the dimensions of the various features are arbitrarily expanded or reduced for clarity. Like numerals denote like features throughout the specification and drawing.

FIGS. 2A-2H are cross-sectional views illustrating a sequence of processing operations used to form a transistor device according to some embodiments of the disclosure;

FIGS. 8A-8I are cross-sectional views illustrating the processing operations used to form a transistor device in the method of FIG. 7, according to some embodiments of the disclosure.

FIGS. 14A-14J are cross-sectional views illustrating the processing operations used to form a transistor device in the method of FIG. 14, according to some embodiments of the disclosure.

DETAILED DESCRIPTION

The disclosure provides a semiconductor transistor and a method for forming the transistor that utilizes a channel region with a film stack including at least one epitaxially-formed semiconductor material layer disposed over the substrate channel region of the transistor. The transistor channel is doped with dopant impurities, some introduced before and some introduced after formation of the film stack, tailoring the profile of dopants in the transistor channel. The tailored dopant profile includes a reduced channel dopant impurity concentration at the interface between the transistor channel and the gate dielectric and also includes dopant impurity regions of high concentration at each of the opposed ends of the transistor channel. According to some exemplary embodiments, a small tilt angle is used to form the high dopant concentration "halo" impurity regions at the edges of the channel. As a result of the formation techniques used, the transistors so-formed are resistant to variations in processing operations and are resistant to short channel effects which arise when the channel length is reduced to increase integration levels and operational speed of the transistor.

Figure 1:
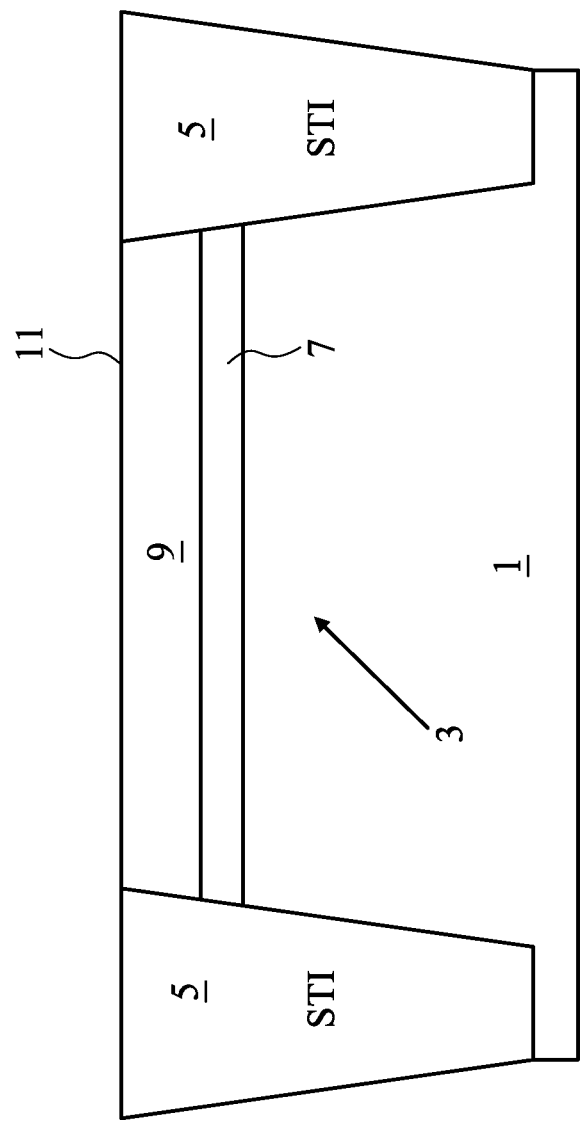
FIG. 1 is a cross-sectional view of an exemplary film structure used in transistor formation according to some exemplary embodiments of the disclosure.

FIG. 1 is a cross-sectional view showing semiconductor substrate 1 with transistor region 3 disposed between two STI (shallow trench isolation) structures 5. A transistor is formed in transistor region 3 to include a channel region with an optimized dopant profile and source/drain regions including separate lightly doped drain, LDD, regions according to exemplary embodiments. The structure of FIG. 1 shows exemplary SiC layer 7, epitaxial silicon layer 9 and top surface 11. SiC layer 7 and epitaxial silicon layer 9 are undoped. The exemplary transistors also include a gate dielectric and gate electrode formed over top surface 11.

FIGS. 2A-2H illustrate an exemplary sequence of processing operations according to some exemplary embodiments of the disclosure. FIG. 2A shows a well/threshold voltage ($V_t$) implant operation used to introduce dopant impurities into substrate 1, particularly in transistor region 3 within which the transistor channel will be formed. Arrows 15 indicate the introduction of the dopant impurities, which can be P-type dopant impurities such as boron or other suitable species, according to some exemplary embodiments, and can be N-type dopant impurities such as phosphorous, antimony, or arsenic, according to other exemplary embodiments. An optional screen oxide layer (not shown) having a thickness of about 50-90 angstroms is formed over top surface 11 in various exemplary embodiments. As referred to herein, the $V_t$ implant introduces dopant impurities of a first dopant impurity type (either N-type or P-type) and is a lower power implant. The $V_t$ implant can use an implant energy of less than 25 eV and in one exemplary embodiment, the implant energy can be about 5-14 EV. Various suitable implantation powers and energies can be used. The $V_t$ implant introduces impurities into the channel to adjust the $V_t$ (threshold voltage) applied to the transistor to open the channel to current flow and may also be referred to as a $V_t$ adjust implant.

An annealing operation can be used to activate the introduced dopants, cure crystalline defects and cause diffusion and redistribution of dopant impurities, as shown in FIG. 2B. Various annealing operations can be used and the annealing operations can drive the implanted dopant impurities deeper into semiconductor substrate 1 as indicated by darkness gradient of FIG. 2B. FIG. 2C shows a film stack formed over top surface 11. SiC layer 19 can be epitaxially deposited over top surface 11 and can include a thickness of about 2-20 nanometers in various exemplary embodiments. Epitaxial silicon layer 21 is formed over SiC layer 19 using epitaxial deposition or other suitable methods. Epitaxial silicon layer 21 can include a thickness of about 5-20 nanometers in various exemplary embodiments and can include a thickness of about 8 nanometers and a top silicon surface 23 in some exemplary embodiments. Silicon carbide, SiC, retards dopant diffusion. Each of SiC layer 19 and epitaxial silicon layer 21 is undoped.

In FIG. 2D, the film stack of SiC layer 19 and epitaxial silicon layer 21 appears as composite layer 25. High-k dielectric layer 27 is formed over upper surface 29 of composite layer 25. High-k dielectric layer 27 can be formed using various suitable dielectric deposition processes. Upper surface 29 is a silicon surface. According to some embodiments, hafnium oxide (HfO) is used, but other suitable high-k gate dielectric materials can be used as high-k dielectric layer 27, in other exemplary embodiments. An optional insulator layer can also be used in conjunction with high-k dielectric layer 27, but is not included in the illustrated embodiment of FIG. 2D. High-k dielectric layer 27 can have a thickness of 2 nanometers in some exemplary embodiments, but can have a thickness that ranges from about 1-20 nanometers in various other exemplary embodiments.

A gate stack is formed as shown in FIG. 2E. The gate stack includes gate electrode 35 and gate dielectric 31 formed from high-k gate dielectric 27 shown in FIG. 2D. The gate stack also defines channel region 37 within semiconductor substrate 1. Gate electrode 35 can be formed of polysilicon or other suitable materials and can be formed using conventional or later developed methods. Various patterning techniques can be used to pattern gate electrode 35 and gate dielectric 31. The gate stack is formed over upper surface 29 of composite film structure 25, which is largely undoped because SiC layer 19 and epitaxial silicon layer 21 were formed after the $V_t$ implantation operation and anneal.

With the gate stack in place, lightly doped drain (LDD) and halo implant operations are then carried out as shown in FIG. 2F. An LDD, operation can be used to form LDD impurity region 43 within semiconductor substrate 1. Each of the LDD and halo implant operations introduces dopant impurities through upper surface 29. The LDD dopant introduction operation and LDD structure 43 is formed of a second impurity type, opposite the first impurity type of the well/$V_t$ implant shown in FIG. 2A. According to some embodiments, LDD region 43 can be N-type with the well/$V_t$ implant operation being P-type. A halo implantation operation is an angled ion implantation process as indicated by arrows 45 in FIG. 2F. Tilt angle 47 can be 15 degrees or less with respect to the vertical, according to various exemplary embodiments. The halo implantation operation introduces dopant impurities of the same dopant impurity type as the well/$V_t$ implantation into the edge, but not the central portion, of channel region 37. According to some embodiments, the halo implantation operation can introduce P-type dopant impurities although N-type dopant impurities can be implanted in other exemplary embodiments. In some exemplary embodiments, the halo implantation operation can be used to introduce a mixture of indium and carbon, and in other exemplary embodiments, the halo implantation operation can be used to introduce indium and boron, such as present in $BF_2$. The implantation conditions and tilt angle are chosen to produce a dopant impurity profile shown in more detail in FIG. 3 and to produce high concentration dopant regions 41 at the opposed edges of channel region 37 as also shown in FIG. 2F. The low tilt angle 47 and presence of undoped composite film layer 25 at the interface between upper surface 29 and gate dielectric 31 in channel region 37 provides a low dopant concentration in the center of channel region 37 at the interface between gate dielectric 31 and upper surface 29. This, too, is shown in detail in FIG. 3.

FIG. 2G shows the structure of FIG. 2F after spacers 49 are formed. Various methods can be used and spacers 49 can be formed of oxide silicon nitride, or combinations thereof.

FIG. 2H shows source/drain implantation operation indicated by arrows 53 which form source/drain regions 55. Source/drain regions 55 include the same, second dopant impurity type as LDD regions 43, and according to some embodiments, LDD region 43 and source/drain regions 45 are N-type regions. After the source/drain formation operation is carried out as shown in FIG. 2H, further processing operations are used to complete processing of the transistor and interconnect the transistor structure to other device features.

Figure 3:
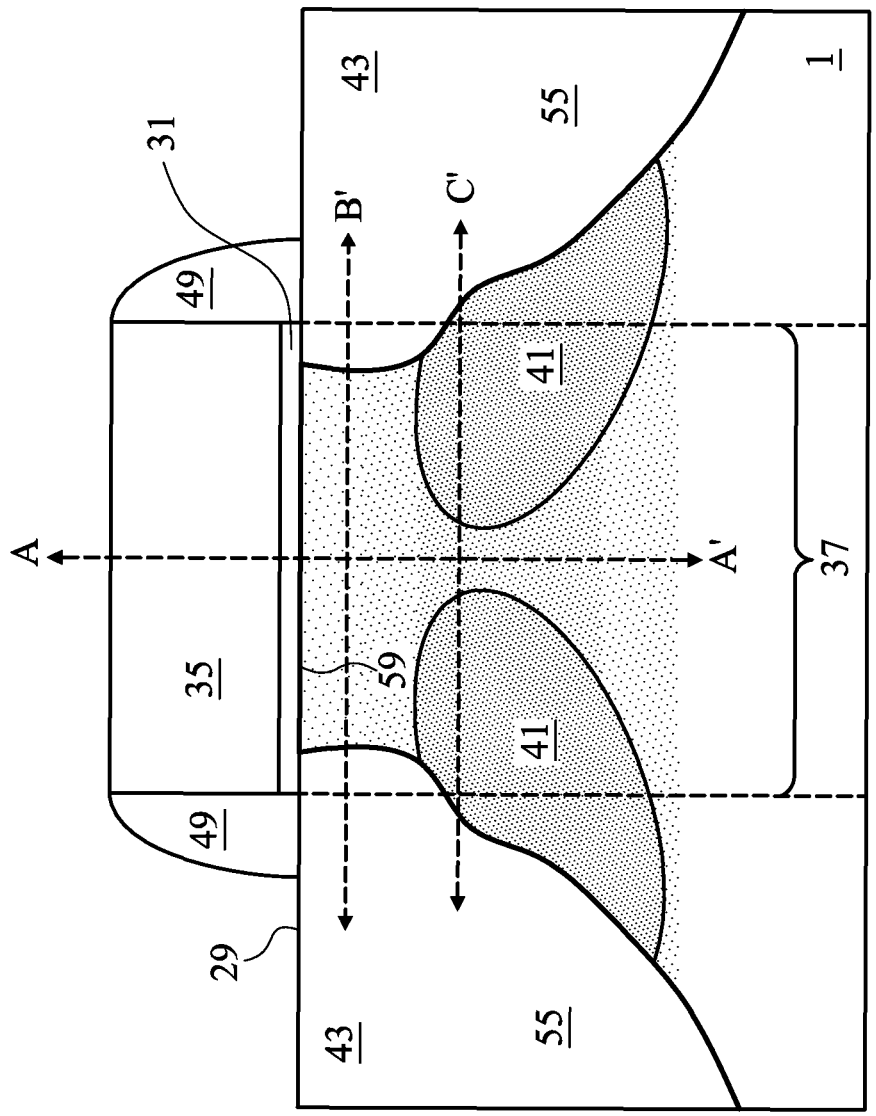
FIG. 3 is a cross-sectional view of an exemplary transistor according to some exemplary embodiments of the disclosure.

FIG. 3 is a cross-sectional view showing an exemplary transistor formed according to the exemplary processing sequence illustrated in FIGS. 2A-2H and more clearly illustrates details of the dopant impurity profile, particularly within and adjacent channel region 37. The transistor in FIG. 3 includes channel region 37, which can be formed of P-type dopant impurities according to some embodiments in which an NMOS transistor is formed. High concentration dopant regions 41 can be formed of P-type dopant impurities at higher concentration levels than other parts of channel region 37, according to some exemplary embodiments. Source/drain regions 55 and LDD regions 43 can be formed of N-type dopant impurities according to some embodiments in which the illustrated transistor is an N-type transistor. Interface 59 is formed between the silicon of upper surface 29 and gate dielectric 31 in channel region 37. Silicon carbide retards boron and indium diffusion, and its presence maintains a suppressed dopant concentration below 1e 18 $cm^{-3}$ at interface 59, which reduces susceptibility to random dopant fluctuation. The dopant profile in channel region 37 is shown graphically in FIGS. 4-6, each of which represent an exemplary embodiment and do not limit the transistor formed according to other embodiments of the disclosure. Each of the graphs of FIGS. 4-6 represents an exemplary embodiment in which the $V_t$ implant and halo implant operations introduce P-type dopant impurities, and illustrate total concentration of P-type dopant impurities within channel region 37.

Figure 4:
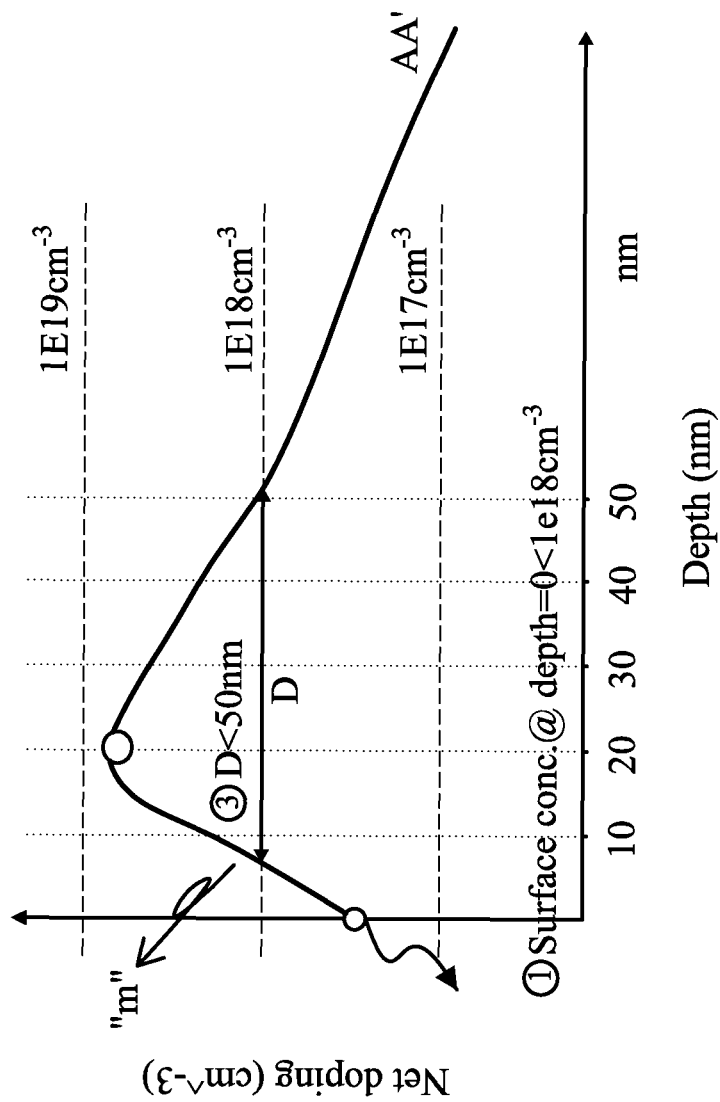
FIG. 4 is a graph that plots dopant concentration as a function of depth in an exemplary transistor channel according to some exemplary embodiments of the disclosure.

FIG. 4 is a graph showing dopant impurity concentration as a function of depth into substrate 1 taken along line A-A' of FIG. 3 and starting from upper surface 29 of FIG. 3, i.e. depth=0 signifies the interface 59 between upper surface 29 and gate dielectric 31. FIG. 4 shows that dopant concentration is less than 1e 18 $cm^{-3}$ at upper surface 29. Surface 29 is a silicon surface, as epitaxial layer 21 is disposed over subjacent SiC layer 19. This is exemplary only and does not limit other embodiments of this disclosure. FIG. 4 also shows that the peak dopant impurity concentration occurs about 10-30 nm below upper surface 29 and is located at about 20 nm from the silicon surface in the exemplary graph of FIG. 4. FIG. 4 also shows that the region "D" in which the dopant concentration is greater than 1e 18 $cm^{-3}$ has a depth of less than 50 nanometers. In summary, FIG. 4 shows that the dopant impurity concentration is less than 1e 18 $cm^{-3}$ at the interface with the gate dielectric and increases to a peak location about 10-30 nm from the silicon surface. FIG. 4 also shows that the region having a dopant impurity concentration greater than 1e 18 $cm^{-3}$ extends for less than about 50 nanometers. The slope "m" of the increase of dopant concentration, as a function of depth from the interface, is significant and can represent an increase of about 1 decade of concentration per about 1-20 nm of channel depth.

Figure 6:
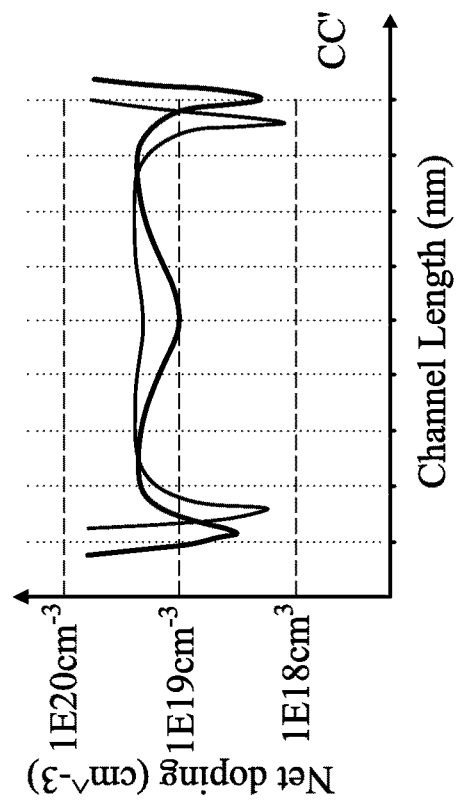
FIGS. 5 and 6 are graphs plotting dopant concentration across a transistor channel according to some exemplary embodiments of the disclosure.
Figure 5:
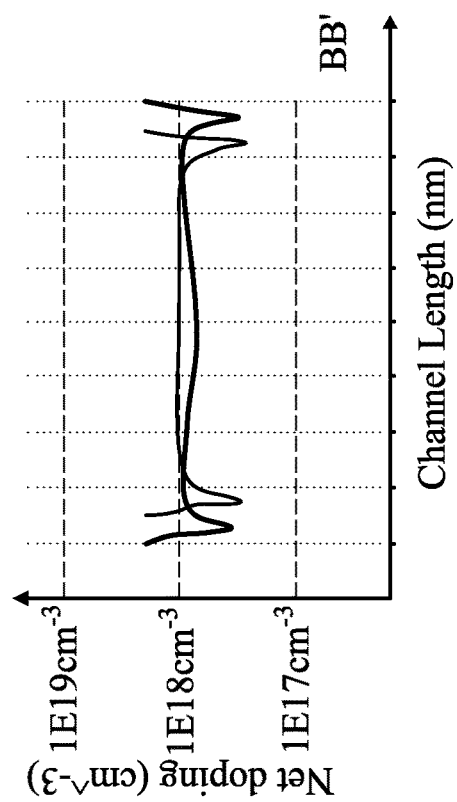

FIGS. 5 and 6 show dopant impurity concentration across channel region 37 at different depths. FIG. 5 shows the dopant impurity concentration along line BB' and FIG. 6 shows the dopant concentration along line CC'. Line BB' and CC' each run left-right along the channel length direction. FIGS. 5 and 6 show that the nominal dopant concentration is greater at line CC', which is disposed further below interface 59, than line BB'. FIGS. 5 and 6 each show that dopant concentration is higher at the edges of channel region 37 than at the center. The high concentration value of the dopant impurities at each of the opposed ends of the channel is attributable to high concentration dopant regions 41. The slope at the opposed edges of the channel representing the increase in dopant concentration, can be at least 1 decade of concentration per about 40 nm of channel distance.

Although the above exemplary embodiments are described for a PMOS transistor, the disclosure applies equally to NMOS transistors according to some embodiments in which the dopant types are reversed from those described above.

In some embodiments, a method forms a transistor. The method comprises providing a semiconductor substrate; introducing dopant impurities of a first impurity type into a transistor region of the semiconductor substrate, the transistor region including a channel region and source/drain regions; forming a silicon carbide layer over the transistor region and forming a silicon layer over the silicon carbide layer. The method further comprises forming a dielectric over the silicon layer; forming a gate electrode over the channel region; performing an angled ion implant to introduce further dopant impurities of the first impurity type, into the semiconductor substrate at edges of the channel region; and forming source/drain impurity structures in the source/drain regions.

Figure 7:
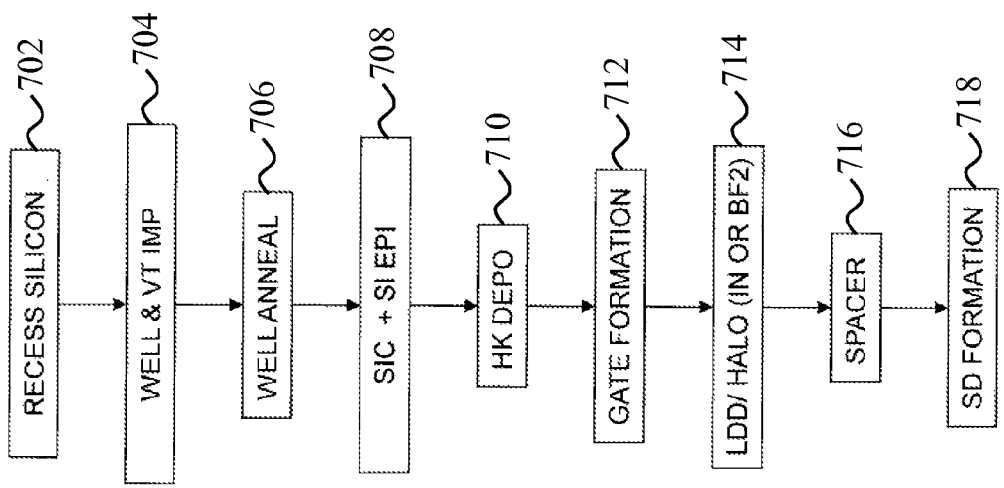
FIG. 7 is a flow chart of a method according to some embodiments of the disclosure.

FIG. 7 is a flow chart of a method according to some embodiments. A cross-sectional view of the substrate in each respective step of FIG. 7 is shown in FIGS. 8A-8I, respectively.

At step 702 of FIG. 7, a recess 12 is formed in a transistor region 3 of a semiconductor substrate 1, extending from one STI region 5 to an adjacent STI region. The recess extends under the regions in which the source, drain and gate of the device will subsequently be formed. In some embodiments, the semiconductor substrate 1 is a silicon substrate. In some embodiments, the recess can be formed by a dry etch process. In some embodiments, the recess depth is in a range from about 5 nm to about 30 nm below a top surface of the STI regions 5. For example, the depth can be 5 nm, 7 nm, 15 nm, 28 nm or 30 nm. The substrate 1 with the recess formed therein is shown in FIG. 8A. The recess described above can make the channel profile more retrograde.

At step 704 of FIG. 7, the well and threshold voltage (Vt) implant is performed. FIG. 8B shows a well/threshold voltage (Vt) implant operation used to introduce dopant impurities of a first impurity type into transistor region 3, where the transistor channel will be formed. Arrows 15 indicate the introduction of the dopant impurities, which can be P-type dopant impurities, such as boron or other suitable species, or N-type dopant impurities, such as phosphorous, antimony, or arsenic. The Vt implant can use an implant energy from about 2 keV to about 20 keV. For example, in some embodiments, the implant energy is 2.2 keV, 10 keV, 15 keV or 19.6 keV.

In some embodiments, the implanted impurity dose for an NFET is in a range from about $1 \times 10^{12}$ $cm^{-3}$ to about $9 \times 10^{13}$ $cm^{-3}$. For example in some embodiments, the dose in an NFET is $1.2 \times 10^{12}$ $cm^{-3}$, $5 \times 10^{12}$ $cm^{-3}$, $1 \times 10^{13}$ $cm^{-3}$, or $8.5 \times 10^{13}$ $cm^{-3}$. In some embodiments, the implanted impurity dose for a PFET is in a range from about $1 \times 10^{12}$ $cm^{-3}$ to about $5 \times 10^{13}$ $cm^{-3}$. For example in some embodiments, the dose in a PFET is $1.2 \times 10^{12}$ $cm^{-3}$, $5 \times 10^{12}$ $cm^{-3}$, $1 \times 10^{13}$ $cm^{-3}$, or $4.7 \times 10^{13}$ $cm^{-3}$. The Vt implant energy and dose contribute to a more retrograde channel profile.

At step 706 of FIG. 7, a well-annealing operation is performed to activate the introduced dopants, cure crystalline defects and cause diffusion and redistribution of dopant impurities, as shown in FIG. 8C.

At step 708 of FIG. 7, a silicon carbide epitaxial layer 19 is formed over the substrate in a channel region, and a silicon epitaxial layer 21 is formed over the SiC layer, as shown in FIG. 8D. In some embodiments, the SiC epitaxial layer 19 has a thickness from about 2 nm to about 15 nm. For example, the thickness of the SiC layer can be 2 nm, 2.3 nm, 10 nm, 14.5 nm, or 15.1 nm. In some embodiments, the Si epitaxial layer 21 has a thickness from about 5 nm to about 30 nm. For example, the thickness of the Si layer 21 can be 5 nm, 5.2 nm, 20 nm, 29 nm, or 30.1 nm. In some embodiments, the SiC layer 19 has a carbon concentration of less than 1 at-%. In some embodiments, the top surface of the Si layer 21 is at the same height as the top surface of the STI regions 5. In other embodiments, the heights of Si layer 21 and STI 5 differ. The Si thickness and SiC layer carbon concentration also contribute to the retrograde channel profile.

At step 710 of FIG. 7, an insulating layer 27, such as a high-k dielectric material, is formed over the film layer 25 (comprising epitaxial SiC layer 19 and epitaxial silicon layer 21), as shown in FIG. 8E. High-k dielectric layer 27 is formed over upper surface 29 of composite layer 25. In some embodiments, the high-k dielectric comprises hafnium oxide (HfO), but other suitable high-k gate dielectric materials are used in other embodiments. High-k dielectric layer 27 has a thickness of about 2 nanometers in some embodiments, but can have a thickness that ranges from about 1 to about 20 nanometers in other embodiments.

At step 712 of FIG. 7, the gate electrode layer is formed over the gate insulating layer 27, and both layers are patterned to form the gate electrode 35 and the gate insulating layer 31. In some embodiments, the gate electrode is formed of a metal. In other embodiments, the gate electrode comprises polysilicon or other suitable materials. Various patterning techniques can be used to pattern gate electrode layer and the gate insulating layer 27 to form the gate electrode 35 and gate dielectric 31, as shown in FIG. 8F.

At step 714 of FIG. 7, the LDD and halo implants are performed, using an angled ion implantation to introduce additional impurities 45 of the first impurity type into the semiconductor substrate 1 at edges of the channel region while a surface 29 of the silicon layer 21 is exposed adjacent the channel region 37. In some embodiments, indium or $BF_2$ is used as the dopant for the LDD and halo implants. Each of the LDD and halo implant operations introduces dopant impurities through upper surface 29. The LDD structure 43 is formed of a second impurity type, opposite the first impurity type of the well/Vt implant 15. In some embodiments, LDD region 43 can be N-type with the well/Vt implant operation being P-type. A halo implantation operation is an angled ion implantation process as indicated by arrows 45 in FIG. 8G. In some embodiments, tilt angle 47 is from 0 degrees to 30 degrees with respect to the vertical. In some embodiments, tilt angle 47 is 15 degrees or less with respect to the vertical. In other embodiments, the angle 47 is greater than 15 degrees. The halo implantation operation introduces dopant impurities of the same dopant impurity type, as the well/Vt implantation into the edge, but not the central portion, of channel region 37. In some embodiments, the halo implantation operation introduces P-type dopant impurities, and in other embodiments, N-type dopant impurities are implanted. In some embodiments, the halo implantation operation is used to introduce a mixture of indium and carbon, and in other embodiments, the halo implantation operation is used to introduce indium and boron, such as present in $BF_2$. The implantation conditions and tilt angle are chosen to produce a dopant impurity profile and to produce high concentration dopant regions 41 at the opposite edges of channel region 37.

At step 716 of FIG. 7, the gate spacers 49 are formed. FIG. 8H shows the structure after spacers 49 are formed. Spacers 49 can be formed of silicon oxide, silicon nitride, or combinations thereof.

At step 718 of FIG. 7, the source and drain implantation is performed. Source/drain regions 55 include the same second dopant impurity type as LDD regions 43. In some embodiments, LDD region 43 and source/drain regions 45 are N-type regions. After the source/drain formation operation is performed as shown in FIG. 8I, further processing operations are used to complete processing of the transistor and interconnect the transistor structure to other devices and/or components.

In considering performance of the device of FIG. 8I, an effective drain current (Ideff) is defined by the following equation:

$$Ieff=(Id\_low+Id\_high)/2, \quad (1)$$

where Id=Id_low when Vd=Vdd, and Vg=Vdd/2,
Id=Id_high when Vd=Vdd/2, and Vg=Vdd

Compared to an otherwise similar device without the recess 12, and without the SiC layer 19, the Si layer 21, the device of FIG. 8I has the characteristics described below with reference to Table 1:

TABLE 1

|  | Baseline | FIG. 8I |
|---|---|---|
| DIBL (mV/V) | reference | −24.2 |
| Iboff(x) | reference | 3.3 |
| Idsat(%) | reference | 5%% |
| Rch(ohm) | reference | −20 |
| Ideff(%) | reference | 10% |
| AVTs | reference | −27.5% | where
DIBL is drain induced barrier lowering,
Iboff is bulk leakage current,
IDsat is saturation current
Rch is channel resistance, and
AVT is the matching coefficient = $\sigma_{\Delta vt} * (WL)^{1/2}$ By forming the recess 12 first, the method of FIG. 7 causes the channel profile 37 (FIG. 9) to be more retrograde, improving DIBL and Ideff. The DIBL improvement results in reduction of device variability and smaller AVT. This method allows a smaller halo implant dose. Both carrier mobility and Ion are improved.

Figure 9:
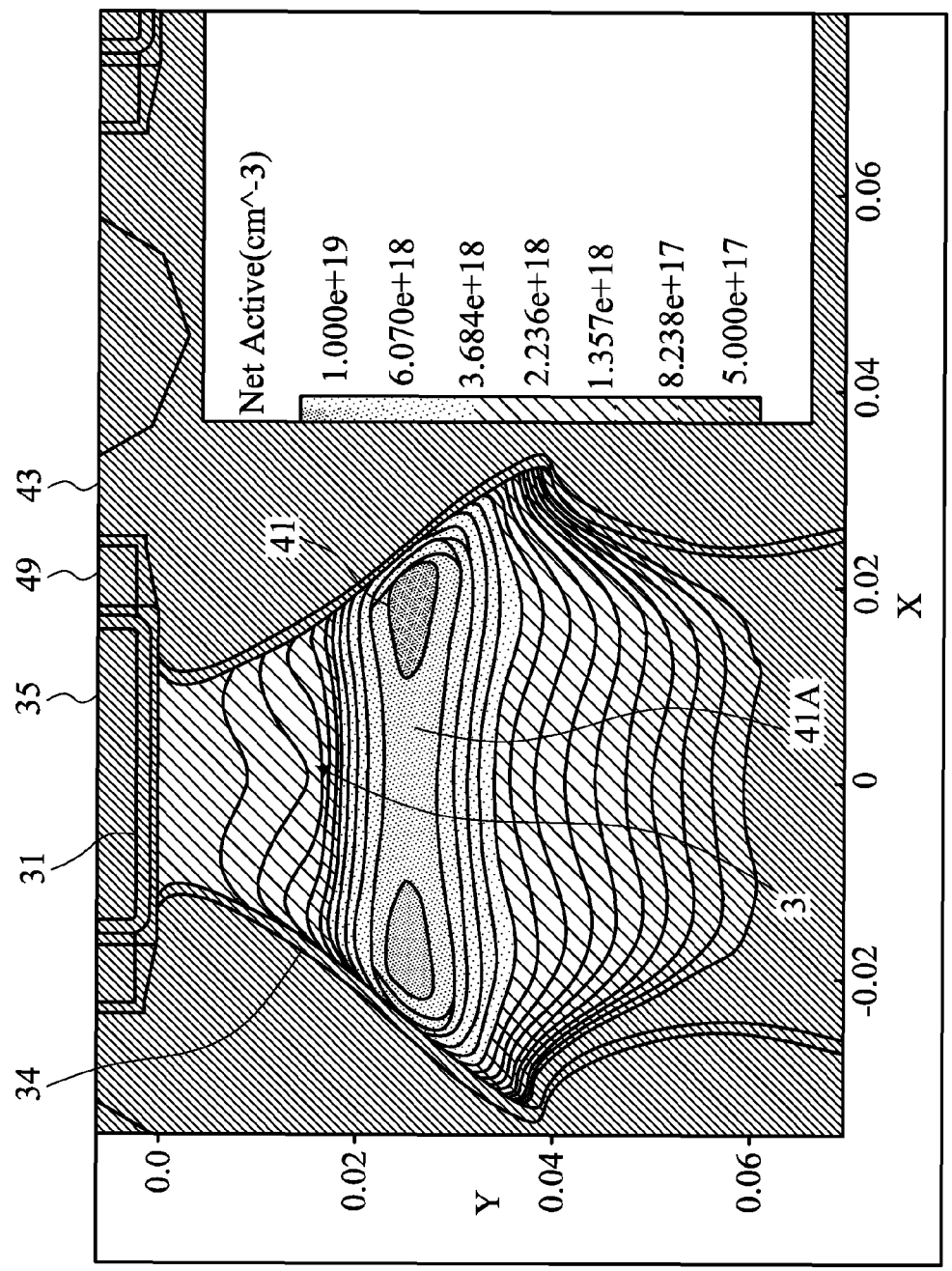
FIG. 9 is a graph showing impurity concentration in the channel of the device of FIG. 8I according to some embodiments of the disclosure.

FIG. 9 is a graph of the dopant profile in a device of FIG. 8I, formed by the method of FIG. 7, according to a simulation. The channel region 3 has a steep retrograde profile 34. The greatest dopant concentration is in the halo regions 41, with a concentration of about $1\times10^{19}$ cm$^{-3}$. A high concentration region 41A (concentration between $6\times10^{18}$ cm$^{-3}$ and $1\times10^{19}$ cm$^{-3}$) connects the two halo regions 41.

Figure 10:
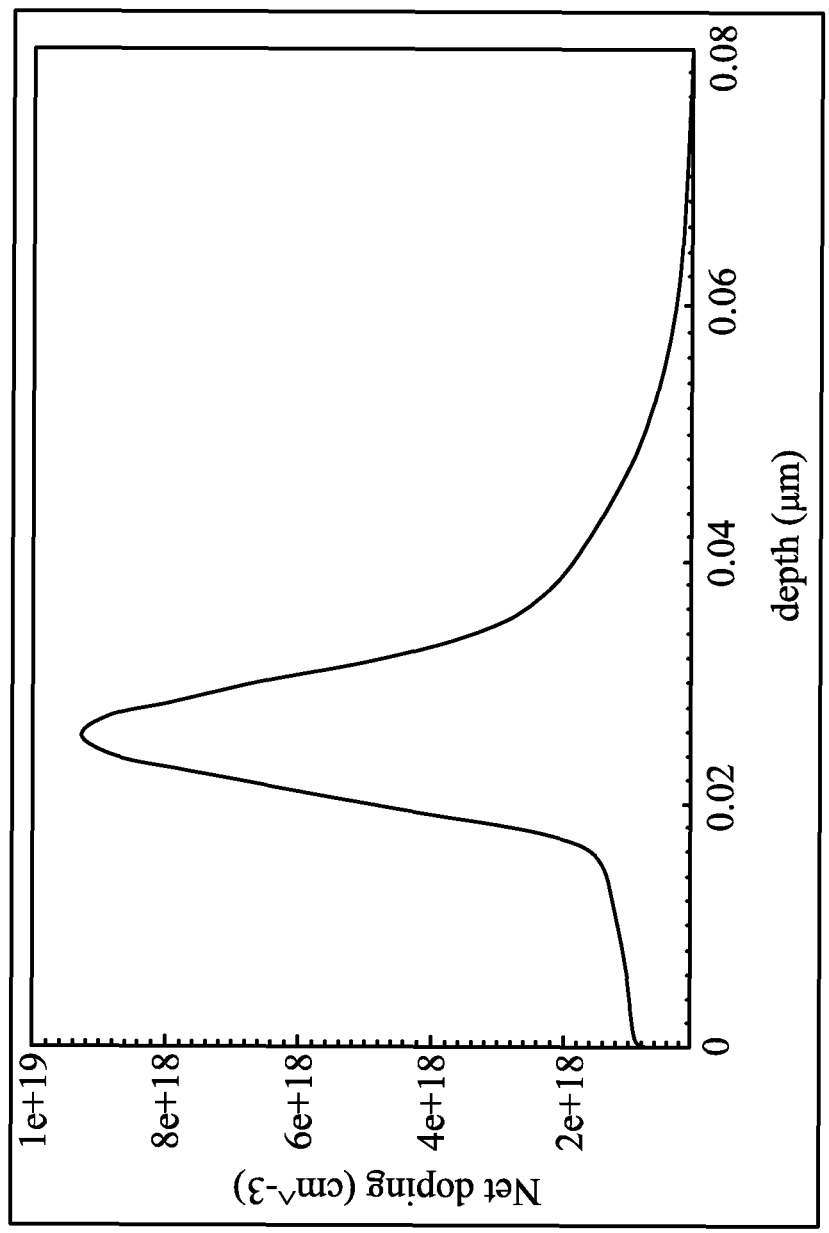
FIG. 10 is graph showing impurity concentration profile as a function of depth at the center of the channel region of the device of FIG. 8I, according to some embodiments of the disclosure.

FIG. 10 is a graph showing dopant impurity concentration as a function of depth at the center of the channel region 37 (beneath the center of the gate electrode 35). The profile has a peak in the high concentration region 41A from a depth of about 0.02 μm to a depth of about 0.03 μm.

Figure 11:
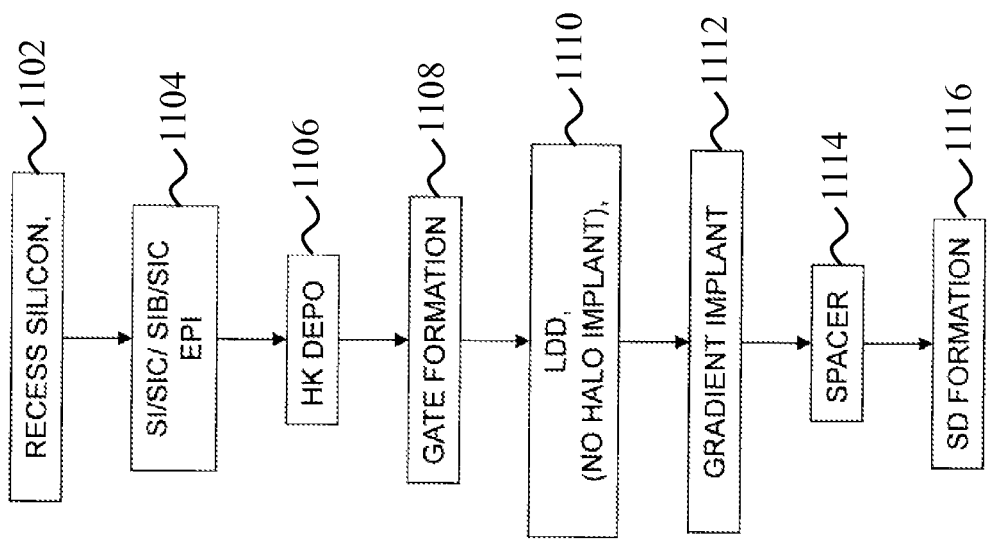
FIG. 11 is a flow chart of a method according to some embodiments of the disclosure.
Figure 13:
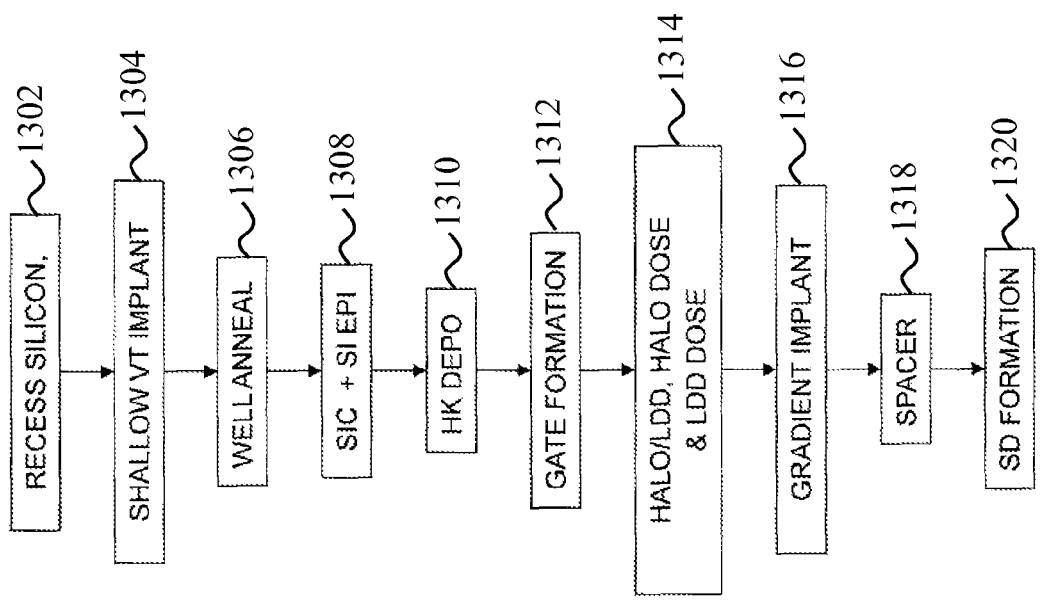
FIG. 13 is a flow chart of a method according to some embodiments of the disclosure.

FIGS. 11 and 13 are flow charts showing two variations of methods according to some embodiments. Characteristics of transistors formed using these two variations are provided after the description of FIG. 13.

FIG. 11 is a flow chart of a first variation of a method of forming a transistor according to some embodiments. In some embodiments, this method produces an ultra-low leakage transistor. A respective cross-sectional view of the substrate in each step of FIG. 11 is shown in FIGS. 12A-12H, respectively.

Figure 12:
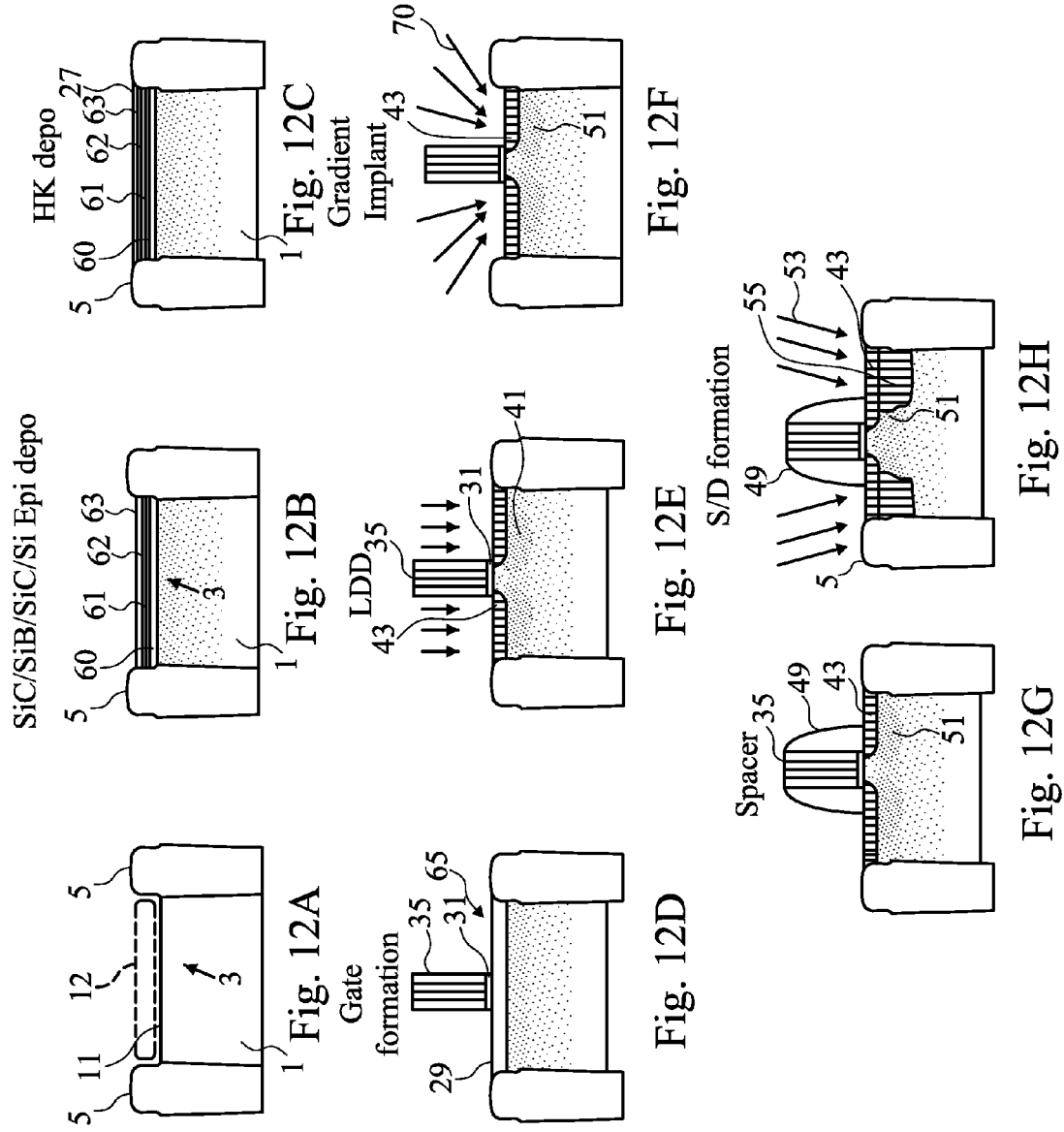
FIGS. 12A-12H are cross-sectional views illustrating the processing operations used to form a transistor device in the method of FIG. 11, according to some embodiments of the disclosure.

At step 1102 of FIG. 11, a recess 12 is formed in a transistor region 3 of a semiconductor substrate 1, extending from one STI region 5 to an adjacent STI region, as shown in FIG. 12A. This step can be the same as step 702 of FIG. 7, and a description thereof is not repeated for brevity.

At step 1104 of FIG. 11, a silicon carbide epitaxial layer 60 is formed over the substrate in a channel region. An intrinsic boron silicon (SiB) or phosphorous silicon (SiP) epitaxial layer 61 is formed on the silicon carbide layer 60. If the device is an NFET, layer 61 is SiB. If the device is a PFET, layer 61 is SiP. In some embodiments, the SiB or SiP epitaxial layer 61 has a thickness from about 2 nm to about 15 nm. For example, the thickness of the SiB or SiP layer can be 2 nm, 2.2 nm, 10 nm, 14.6 nm, or 15.1 nm. The intrinsic charge concentration of boron (or phosphorus) in the SiB (or SiP) layer 61 is less than $10^{20}$ cm$^{-3}$. The SiB or SiP dose and thickness can be used to reduce the Vt-implant and/or halo implant doses, which can effectively reduce leakage.

Another silicon carbide epitaxial layer 62 is formed on the SiB or SiP layer 61. In some embodiments, the SiC epitaxial layers 60, 62 each have a thickness from about 2 nm to about 15 nm. For example, the thickness of the SiC layers can be 2 nm, 2.3 nm, 10 nm, 14.5 nm, or 15.1 nm. A silicon epitaxial layer 63 is formed over the SiC layer 62. In some embodiments, the Si epitaxial layers 61, 63 have a thickness from about 5 nm to about 30 nm. For example, the thickness of the Si layers 61, 63 can be 5 nm, 5.2 nm, 20 nm, 29 nm, or 30.1 nm. In some embodiments, the SiC layers 60, 62 have a carbon concentration of less than 1 at-%. The thickness and carbon concentration of SiC layer 62, and the thickness of the Si layer 61, as described above, contribute to the retrograde channel profile. The substrate 1 with the four epitaxial layers 61-63 formed thereon is shown in FIG. 12B. In some embodiments, the top surface of the Si layer 63 is at the same height as the top surface of the STI regions 5. In other embodiments, the heights of Si layer 63 and STI 5 differ.

At step 1106 of FIG. 11, an insulating layer 27, such as a high-k dielectric material, is formed over the composite epitaxial film structure (comprising epitaxial SiC layer 60, SiB or SiP layer 61, SiC layer 62 and epitaxial silicon layer 63), as shown in FIG. 12C. High-k dielectric layer 27 is formed over upper surface 29 of composite layer 60-63 (collectively labeled 25 in FIG. 12D). In some embodiments, the high-k dielectric 27 comprises hafnium oxide (HfO), but other suitable high-k gate dielectric materials are used in other embodiments. High-k dielectric layer 27 has a thickness of 2 nanometers in some embodiments, but can have a thickness that ranges from about 1 to about 20 nanometers in other embodiments.

At step 1108 of FIG. 11, the gate electrode layer is formed over the gate insulating layer 27, and patterned to form the gate electrode 35 and the gate insulating layer 31, as shown in FIG. 12D. In some embodiments, the gate electrode 35 is formed of a metal. In other embodiments, the gate electrode comprises polysilicon or other suitable materials.

At step 1110 of FIG. 11, the LDD implant is performed to introduce impurities 45 of the second impurity type into the semiconductor substrate 1 in the areas which will become the source and drain regions adjacent the gate electrode 35. In some embodiments, as shown in FIG. 11, an LDD implant with a dosage of about $10^{15}$ cm$^{-3}$ or less is performed, but halo implants are not needed. In some embodiments, indium or $BF_2$ is used as the dopant for the LDD implant. The LDD implant operation introduces dopant impurities through upper surface 29. The LDD structure 43 is formed of a second impurity type, opposite the first impurity type of the well/Vt implant 15. In some embodiments, LDD region 43 can be N-type with the well/Vt implant operation being P-type. The LDD implant is shown in FIG. 12E.

At step 1112 of FIG. 11, a gradient implant is performed. In the gradient implant step, the first dopant can be implanted at an angle from multiple orientations with respect to the surface 29. For example, the first dopant can be implanted from three or four different orientations with respect to the gate component. The implantation from a plurality of different orientations can be performed simultaneously or sequentially. The resulting lightly doped region concentration varies in a gradient manner from a lightest doped concentration that extends laterally under a portion of the gate 35 (e.g. adjacent to the channel region 37) to a highest concentration at the bottom of the source and/or drain region). In some embodiments, the implant energy varies from about 2 keV to about 15 keV. The gradient implant region 51 is shown in FIG. 12F. In some embodiments, the range of dose for the gradient implant is from about $1 \times 10^{13}$ cm$^{-3}$ to about $1 \times 10^{14}$ cm$^{-3}$ for both n-FETs and for p-FETs. For example, in some embodiments, the range of dose for the gradient implant is from $0.9 \times 10^{13}$ cm$^{-3}$ to $1.1 \times 10^{14}$ cm$^{-3}$. The gradient implant described above can reduce the p-n junction electric field, thereby reducing the leakage.

At step 1114 of FIG. 11, the gate spacers 49 are formed. FIG. 12G shows the structure after spacers 49 are formed. Spacers 49 can be formed of silicon oxide, silicon nitride, or combinations thereof.

At step 1116 of FIG. 11, the source and drain implantation is performed. Source/drain regions 55 include the same second dopant impurity type as LDD regions 43, as shown in FIG. 12H. This step can be the same as step 718 of FIG. 7, the description of which is not repeated for brevity.

FIG. 13 is a flow chart of a second variation of a method according to some embodiments. A respective cross-sectional view of the substrate in each step of FIG. 13 is shown in FIGS. 14A-14J, respectively.

At step 1302 of FIG. 13, a recess 12 is formed in a transistor region 3 of a semiconductor substrate 1, extending from one STI region 5 to an adjacent STI region. The recess extends under the regions in which the source, drain and gate of the device will be formed. In some embodiments, the semiconductor substrate 1 is a silicon substrate. In some embodiments, the recess can be formed by a dry etch process. In some embodiments, the recess depth is in a range from about 5 nm to about 30 nm below a top surface of the STI regions 5. This recess thickness contributes to the highly retrograde channel profile. The substrate 1 with the recess formed therein is shown in FIG. 14A.

At step 1304 of FIG. 13, the shallow threshold voltage (Vt) implant is performed. FIG. 14B shows a well/threshold voltage (Vt) implant operation used to introduce dopant impurities of a first impurity type. Arrows 15 indicate the introduction of the dopant impurities, which can be P-type dopant impurities, such as boron or other suitable species, or N-type dopant impurities, such as phosphorous, antimony, or arsenic. The Vt implant can use an implant energy from about 2 keV to about 15 keV. For example, in some embodiments, the implant energy is 2.1 keV, 10 keV, 15 keV or 15.2 keV.

In some embodiments, the implanted impurity dose for an NFET is in a range from about $1.0 \times 10^{12}$ cm$^{-3}$ to about $9 \times 10^{13}$ cm$^{-3}$. For example, in some embodiments, the implanted impurity dose for an NFET is in a range from $0.9 \times 10^{12}$ cm$^{-3}$ to $9.5 \times 10^{13}$ cm$^{-3}$. In some embodiments, the implanted impurity dose for a PFET is in a range from about $1.0 \times 10^{12}$ cm$^{-3}$ to about $5 \times 10^{13}$ cm$^{-3}$. For example, in some embodiments, the implanted impurity dose for a PFET is from $1.1 \times 10^{12}$ cm$^{-3}$ to $5.4 \times 10^{13}$ cm$^{-3}$. The Vt implant energy and dose contribute to the highly retrograde channel profile.

At step 1306 of FIG. 13, a well-annealing operation is performed to activate the introduced dopants, cure crystalline defects and cause diffusion and redistribution of dopant impurities, as shown in FIG. 14C.

At step 1308 of FIG. 13, a silicon carbide epitaxial layer 19 is formed over the substrate in a channel region, and a silicon epitaxial layer 21 is formed over the SiC layer, as shown in FIG. 14D. In some embodiments, the SiC epitaxial layer 19 has a thickness from about 2 nm to about 15 nm. In some embodiments, the Si epitaxial layer 21 has a thickness from about 5 nm to about 30 nm. In some embodiments, the SiC layer 19 has a carbon concentration of less than 1 at-%. The thickness and carbon concentration of SiC layer 19 and the thickness of the Si layer 21 contribute to the highly retrograde channel profile. In some embodiments, the top surface of the Si layer 21 is at the same height as the top surface of the STI regions 5. In other embodiments, the heights of Si layer 21 and STI 5 differ.

At step 1310 of FIG. 13, an insulating layer 27, such as a high-k dielectric material, is formed over the film layer 25 (comprising epitaxial SiC layer 19 and epitaxial silicon layer 21), as shown in FIG. 14E. In some embodiments, the high-k dielectric comprises hafnium oxide (HfO), but other suitable high-k gate dielectric materials are used in other embodiments. High-k dielectric layer 27 has a thickness of 2 nanometers in some embodiments, but can have a thickness that ranges from about 1 to about 20 nanometers in other embodiments.

At step 1312 of FIG. 13, the gate electrode layer is formed over the gate insulating layer 27, and both are patterned to form the gate electrode 35 and the gate insulating layer 31. In some embodiments, the gate electrode is formed of a metal. The resulting configuration is shown in FIG. 14F.

At step 1314 of FIG. 13, the LDD and halo implants are performed as indicated by arrows 45 in FIG. 14G, In some embodiments, the LDD dosage is less than $10^{15}$ cm$^{-3}$, and the halo dosage is less than $10^{13}$ cm$^{-3}$. In other respects, the LDD and halo implant operations can be the same as described above with respect to step 714 of FIG. 7, and for brevity, the description thereof is not repeated.

At step 1316 of FIG. 13, a gradient implant is performed as shown in FIG. 14H. In some embodiments, the gradient implant step is as described above with respect to step 1112 of FIG. 11, and for brevity, the description thereof is not repeated.

At step 1318 of FIG. 13, the gate spacers 49 are formed. FIG. 14I shows the structure after spacers 49 are formed. Spacers 49 can be formed of silicon oxide, silicon nitride, or combinations thereof.

At step 1320 of FIG. 13, the source and drain implantation is performed. Source/drain regions 55 include the same second dopant impurity type as LDD regions 43. In some embodiments, LDD region 43 and source/drain regions 45 are N-type regions. After the source/drain formation operation is performed as shown in FIG. 14J, further processing operations are used to complete processing of the transistor and interconnect the transistor structure to other devices and/or components.

Figure 15A:
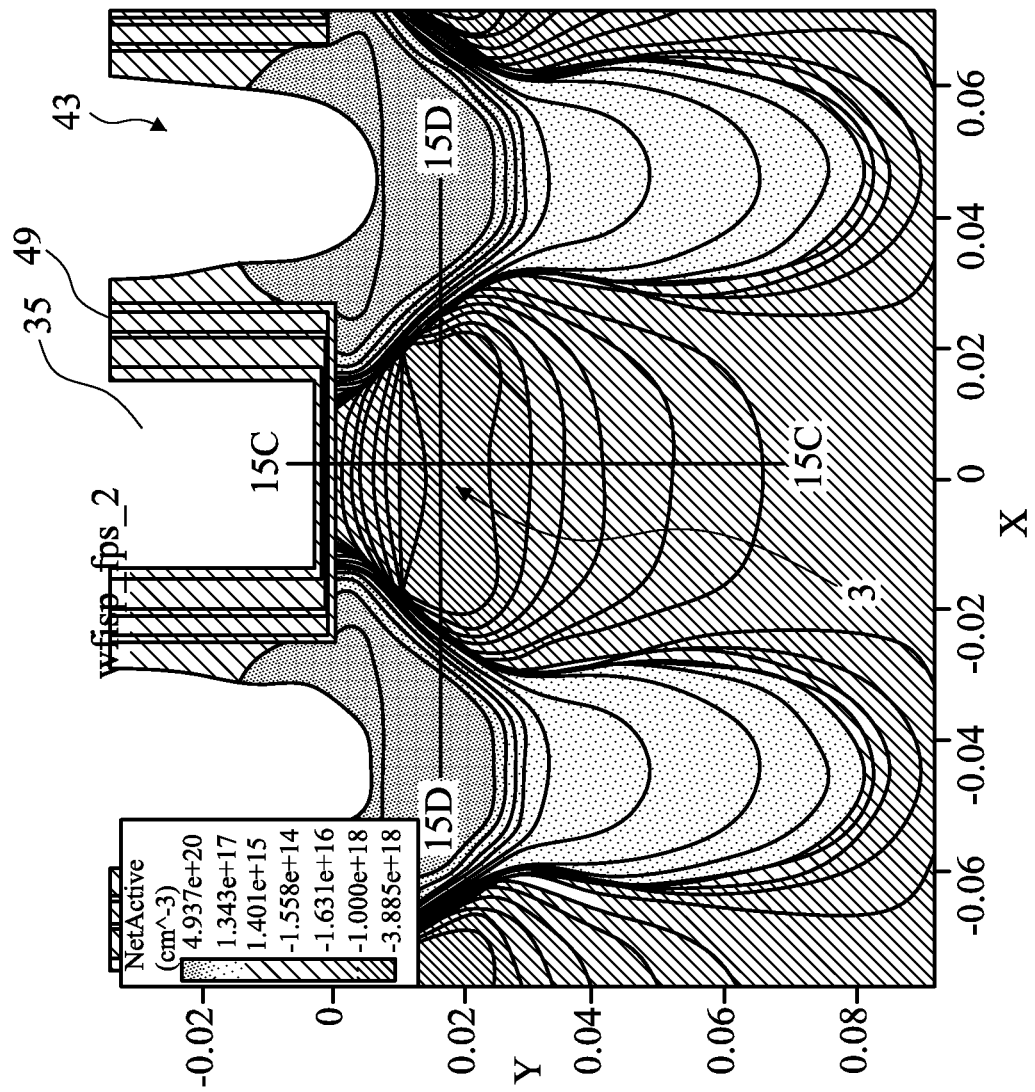
FIG. 15A is a graph showing impurity concentration in the channel and source/drain regions of the device of FIG. 12H according to some embodiments of the disclosure.

For the device shown in FIG. 15A, an example of simulated properties are shown in Table 2, compared to the baseline configuration without the recess and without the gradient implant region 51. Table 2 summarizes the characteristics of transistors formed by the two variations of the methods shown in some embodiments according to FIGS. 11 and 13, respectively.

TABLE 2

|  | Baseline | FIG. 11 | FIG. 13 |
|---|---|---|---|
| Halo center | $1.18 \times 10^{14}$ cm$^{-3}$ | N/A | $8.6 \times 10^{12}$ cm-3 |
| SiB concentration | N/A | $1.86 \times 10^{19}$ | $1.86 \times 10^{19}$ |
| Isoff (µA/µm) | 9.26 | 9.05 | 9.23 |
| Ion (%) | reference | 5.2% | 3.6% |
| Ideff(%) | reference | 15.7% | 15.7% |
| DIBL (mV/V) | reference | 4.2 | −20.6 |
| Iboff (pA/µm) | 263.6 | 46.5 | 122.3 |

Notably, the device formed by the method of FIG. 13 has a low leakage (Iboff) of 122.3 compared to 263.6 for the baseline device without the recess, without the film stack 60-63 beneath the gate dielectric 31 and without the gradient implant region 51. The SiB or SiP dose and thickness in Table 2 reduce the Vt-imp and halo implant dose, which in turn can effectively reduce leakage. The device formed by the method of FIG. 11 has an even lower leakage (Iboff) of 46.5 compared to the baseline device. In some embodiments, Iboff can be reduced to 0.2 times that of the baseline device. In various embodiments, the leakage is reduced by a multilayer epitaxial film (SiC/Si or SiC/SiB/SiC/Si), elimination of the halo implant 41 (or in some embodiments a smaller halo implant than the baseline device), the addition of a gradient implant region 51 after forming the recess, and/or a steep retrograde channel impurity profile as a function of depth below the center of the channel region 37.

FIGS. 15A-15D show simulation results for devices according to the methods of FIGS. 11 and 13. FIG. 15A shows the impurity concentration of a device formed by the method of FIG. 11 according to some embodiments. The concentration of the second impurity in the channel region 37 at a depth from about 15 nm to about 25 nm $3.8 \times 10^{18}$ cm$^{-3}$. The concentration of the first impurity type in the LDD regions is about $1.3 \times 10^{17}$ cm$^{-3}$, and the concentration of the first impurity type in the source and drain regions is about $5 \times 10^{20}$ cm$^{-3}$.

Figure 15B:
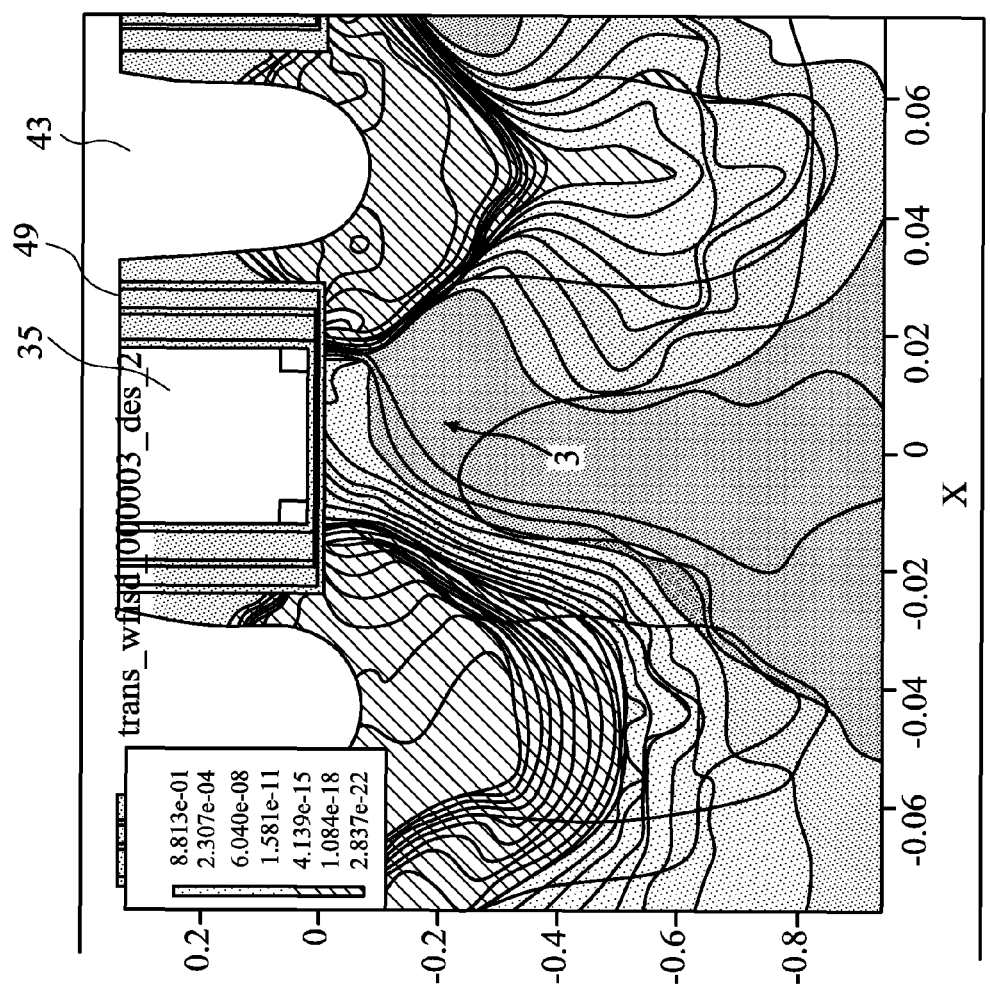
FIG. 15B is a diagram of doping concentration along line 15B-15B of FIG. 15A.
Figure 15D:
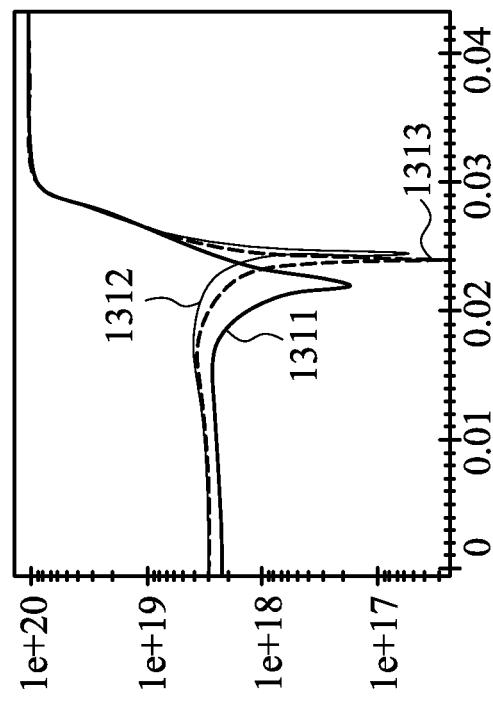
FIG. 15D is a graph showing impurity concentration in the channel and source/drain regions of the device of FIG. 14J according to some embodiments of the disclosure.
Figure 15C:
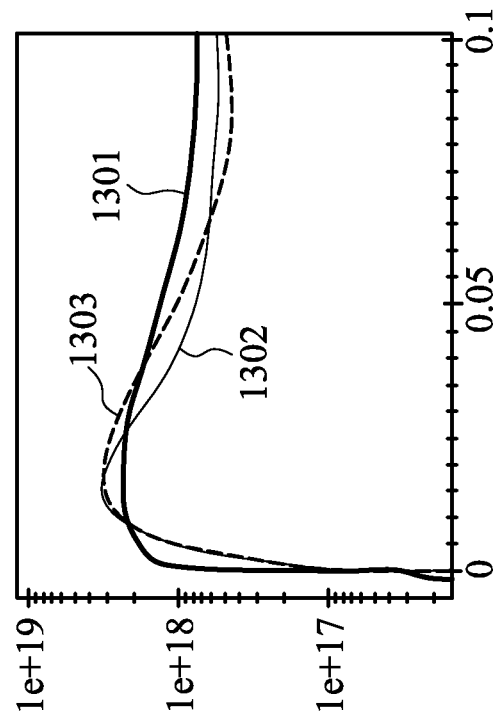
FIG. 15C is a diagram of leakage current (Iboff) along line 15C-15C of FIG. 15A.

FIG. 15C shows the net dopant concentration of the device formed by the method of FIGS. 11 and 13 in the center of the channel region 3, as a function of depth along line 15C-15C of FIG. 15A. Curve 1301 is the dopant profile of a baseline device without any recess, SiB layer or gradient implant. Curve 1302 shows the dopant profile of a device having the SiC/SiB/SiC/Si film stack 60-63 and the gradient implant 51 as shown in FIG. 11 according to some embodiments. Curve 1303 shows the dopant profile of a device having the shallow Vt implant, well anneal, SiC/Si film stack 19, 21, halo 41 and gradient 51 implants as shown in FIG. 13 according to some embodiments. The dopant profiles in curves 1302 and 1303 reach higher peaks concentrations and taper off more quickly FIG. 15D shows the net dopant concentration of the device formed by the methods of FIGS. 11 and 13 along a horizontal section line 15D-15D through the channel region 3, along line 15D-15D of FIG. 15A. Curve 1311 is the profile of the baseline device (without the SiC/SiB/SiC/Si film stack 60-63 and the gradient implant 51). Curve 1312 shows the dopant profile of a device having the SiC/SiB/SiC/Si film stack 60-63 and the gradient implant 51 as shown in FIG. 11 according to some embodiments. Curve 1313 shows the dopant profile of a device having the shallow Vt implant, well anneal, SiC/Si film stack 19, 21, halo 41 and gradient 51 implants as shown in FIG. 13 according to some embodiments. The dopant profiles in curves 1312 and 1313 reach higher peaks concentrations at the center of the channel, and taper off more quickly towards the edge of the channel region.

FIG. 15B shows the leakage (Iboff) of the device according to the method of FIG. 11. The leakage current in the S/D regions is about $1.58 \times 10^{-11}$ A-cm$^{-2}$. Compared to an otherwise similar device without the recess 12, and without the SiC layer 19, the Si layer 21, the device of FIG. 15D has the characteristics described above in Table 3:

In some embodiments, a method forms a transistor on a semiconductor substrate. The method comprises forming a composite film structure over a transistor channel after implanting dopant impurities of a first impurity type into the channel, prior to forming a gate electrode over the transistor channel and prior to performing an angled ion implantation operation that implants further dopant impurities of the first impurity type, the composite film structure comprising a silicon layer disposed over a silicon carbide layer.

In some embodiments, a transistor is disposed on the semiconductor substrate. The transistor comprises a gate electrode formed in a channel region over a gate dielectric formed over a substrate surface. The transistor further comprises a transistor channel formed in the substrate in the channel region and having a peak dopant concentration about 10-30 nanometers below the substrate surface, a surface dopant concentration less than about 1e 18 $cm^{-3}$ at the surface, and the transistor channel having edge portions aligned beneath opposed edges of the gate electrode and having higher dopant concentrations than the central portion of the channel.

In some embodiments, a method for forming a transistor comprises: forming a recess in a transistor region of a semiconductor substrate; introducing impurities of a first impurity type into the transistor region; forming a silicon carbide layer over a channel region in the transistor region; forming a silicon layer over the silicon carbide layer; forming a gate dielectric over the silicon layer above the channel region; forming a gate electrode over the gate dielectric above the channel region; and performing an angled ion implantation to introduce additional impurities of the first impurity type into the semiconductor substrate at edges of the channel region while a surface of the silicon layer is exposed adjacent the channel region.

In some embodiments, a method for forming a transistor comprises: forming a recess in a transistor region of a semiconductor substrate; forming a first silicon carbide layer over a channel region in the transistor region; forming an SiB or SiP layer over the first silicon carbide layer; forming a second silicon carbide layer over the SiB or SiP layer; forming a silicon layer over the second silicon carbide layer; forming a gate dielectric over the silicon layer above the channel region; forming a gate electrode over the gate dielectric above the channel region; and performing a gradient implant in the transistor region.

In some embodiments, a transistor comprises a semiconductor substrate having a transistor region with a recess therein, the substrate having impurities of a first impurity type in the transistor region. A silicon carbide layer is over a channel region in the transistor region. A silicon layer is over the silicon carbide layer. A gate dielectric is over the silicon layer above the channel region; A gate electrode is over the gate dielectric above the channel region. Additional impurities of the first impurity type are provided in the semiconductor substrate at edges of the channel region. A gradient implant dosage of impurities of a second type opposite the first type is provided in source and drain regions of the transistor region.

The preceding merely illustrates the principles of the disclosure. It will thus be appreciated that those skilled in the art will be able to devise various arrangements which, although not explicitly described or shown herein, embody the principles of the disclosure and are included within its spirit and scope. Furthermore, all examples and conditional language recited herein are to be construed as being without limitation to such specifically recited examples and conditions. Moreover, all statements herein reciting principles, aspects, and embodiments of the disclosure, as well as specific examples thereof, encompass both structural and functional equivalents thereof. Additionally, such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments of the disclosure, which may be made by those skilled in the art without departing from the scope and range of equivalents of the disclosure.

What is claimed is:

1. A method for forming a transistor comprising:
    forming a recess in a transistor region of a semiconductor substrate, the recess extending continuously from a first shallow trench isolation (STI) region at a first end of the transistor region to a second STI region at a second end of the transistor region;
    introducing impurities of a first impurity type into the transistor region;
    forming a first silicon carbide layer over a channel region in the recess of the transistor region;
    forming an SiB or SiP layer over the first silicon carbide layer;
    forming a second silicon carbide layer over the SiB or SiP layer;
    forming a silicon layer over the second silicon carbide layer in the recess of the transistor region;
    forming a gate dielectric over the silicon layer above the channel region after forming the recess;
    forming a gate electrode over the gate dielectric above the channel region; and
    performing an angled ion implantation to introduce additional impurities of the first impurity type into the semiconductor substrate under the gate electrode, within the channel region at edges thereof while a surface of the silicon layer is exposed adjacent the channel region.

2. The method of claim 1, wherein the recess has a depth from about 5 nm to about 30 nm.

3. The method of claim 1, wherein the step of introducing impurities is performed with an energy from about 2keV to about 20keV.

4. The method of claim 1, wherein the transistor is an n-MOSFET, and the step of introducing provides an impurity concentration from about $10^{12}$ $cm^{-3}$ to about $9\times10^{13}$ $cm^{-3}$.

5. The method of claim 1, wherein the transistor is a p-MOSFET, and the step of introducing provides an impurity concentration from about $10^{12}$ $cm^{-3}$ to about $5\times10^{13}$ $cm^{31\ 3}$.

6. The method of claim 1, wherein the silicon layer has a thickness from about 5 nm to about 30 nm.

7. A method for forming a transistor comprising:
   forming a recess in a transistor region of a semiconductor substrate;
   forming a first silicon carbide layer over a channel region in the transistor region;
   forming an SiB or SiP layer over the first silicon carbide layer;
   forming a second silicon carbide layer over the SiB or SiP layer;
   forming a silicon layer over the second silicon carbide layer;
   forming a gate dielectric over the silicon layer above the channel region;
   forming a gate electrode over the gate dielectric above the channel region; and
   performing a gradient implant in the transistor region.

8. The method of claim 7, wherein the recess has a depth from about 5 nm to about 30 nm.

9. The method of claim 7, wherein the SiB or SiP layer has an intrinsic Boron or Phosphorous concentration of about $10^{20}$ cm$^{-3}$ or less.

10. The method of claim 7, wherein the SiB or SiP layer has a thickness from about 2 nm to about 15 nm.

11. The method of claim 7, the gradient implant has an energy from about 2keV to about 14EV.

12. The method of claim 7, further comprising performing a lightly doped drain implant between forming the gate electrode and performing the gradient implant.

13. A method for forming a transistor, comprising
   forming a recess in a transistor region of a semiconductor substrate, the recess extending continuously from a first shallow trench isolation (STI) region at a first end of the transistor region to a second STI region at a second end of the transistor region, the substrate having impurities of a first impurity type in the transistor region;
   forming a first silicon carbide layer over a channel region in the transistor region after forming the recess;
   forming an SiB or SiP layer over the first silicon carbide layer;
   forming a second silicon carbide layer over the SiB or SiP layer;
   forming a silicon layer over the second silicon carbide layer;
   forming a gate dielectric on the silicon layer above the channel region;
   forming a gate electrode over the gate dielectric above the channel region;
   implanting additional impurities of the first impurity type in the semiconductor substrate under the gate electrode, within the channel region thereof; and
   implanting a gradient implant dosage of impurities of a second type opposite the first type in source and drain regions of the transistor region.

14. The method of claim 13, wherein the recess has a depth from about 5 nm to about 30 nm.

15. The method of claim 14, wherein the silicon layer has a thickness of about 5 nm to about 30 nm.

16. The method of claim 13, wherein the transistor has a lightly doped drain region with an implant dosage about $10^{15}$ cm$^{-3}$ or less.

17. The method of claim 13, wherein the additional impurities have a concentration of about $10^{13}$ cm$^{-3}$ or less.

18. The method of claim 13, wherein the silicon carbide layer has a carbon atom percentage of about 1% or less.

19. The method of claim 13, wherein the gate dielectric comprises a high-k dielectric material.

20. The method of claim 13, wherein the transistor has a peak dopant impurity concentration about 20 nm to about 30 nm below an upper surface of the substrate.

* * * * *